United States Patent [19]
Bantu et al.

[11] Patent Number: 6,072,006
[45] Date of Patent: Jun. 6, 2000

[54] PREPARATION OF PARTIALLY CROSS-LINKED POLYMERS AND THEIR USE IN PATTERN FORMATION

[75] Inventors: Nageshwer Rao Bantu, Barrington; Donald Frank Perry, North Providence; Jacqueline Marie Marshall, Tiverton; Timothy Michael Holt, Providence, all of R.I.

[73] Assignee: Arch Specialty Chemicals, Inc., Norwalk, Conn.

[21] Appl. No.: 09/186,916

[22] Filed: Nov. 6, 1998

[51] Int. Cl.$^7$ .................................................. C08F 261/02
[52] U.S. Cl. .......................... 525/262; 525/312; 525/313
[58] Field of Search ..................... 525/262, 312, 525/313

[56] References Cited

U.S. PATENT DOCUMENTS

| | | | |
|---|---|---|---|
| 4,963,463 | 10/1990 | Koshiba et al. | 430/191 |
| 5,035,979 | 7/1991 | Nguyen-Kim et al. | 430/270 |
| 5,069,997 | 12/1991 | Schwalm et al. | 430/270 |
| 5,389,494 | 2/1995 | Kim | 430/270 |
| 5,468,589 | 11/1995 | Urano et al. | 430/270 |
| 5,547,812 | 8/1996 | Collins et al. | 430/910 |
| 5,558,978 | 9/1996 | Schaedeli et al. | 430/910 |
| 5,648,196 | 7/1997 | Frechet et al. | 522/31 |
| 5,650,259 | 7/1997 | Imai et al. | 430/258 |
| 5,670,299 | 9/1997 | Urano et al. | 430/326 |
| 5,714,559 | 2/1998 | Schacht et al. | 526/313 |

OTHER PUBLICATIONS

Article entitled *"Novel Deep UV Photoresist Based On Thermanl Cross–Linking and De–Crossing–Linking of Cross–Linkable Photoacid Generator"* by Moon et al. as appeared in *Journal of Photopolymer Science and Technology*, vol. 11, No. 3 (1998), pp. 439–443.

Primary Examiner—Rachel Gorr
Attorney, Agent, or Firm—Ohlandt, Greeley, Ruggiero & Perle

[57] ABSTRACT

This invention relates to a process for generating a organically soluble partially cross-linked acid labile polymer according to the present invention comprises the steps of providing a polymer with one or more monomer units, wherein at least one of the monomer units contain one or more pendant COOH or hydroxyl groups; and reacting said polymer with a polyvinyl ether in the presence of a acid catalyst to form links between at least two polymer chains. The resulting polymer can be used as a component in a photoresist formulation.

15 Claims, No Drawings

PREPARATION OF PARTIALLY CROSS-LINKED POLYMERS AND THEIR USE IN PATTERN FORMATION

FIELD OF THE INVENTION

The present invention relates to a process for preparing polymers, which are used in the production of images. More particularly, it relates to the preparation of partially cross-linked acid labile polymers comprising hydroxyl or COOH groups, acid labile protecting groups and acid labile polymer chain linking groups.

BACKGROUND TO THE INVENTION

The wavelength of light for lithography has been reduced into the deep ultraviolet (DUV) range to produce the feature size necessary for current and future electronics devices. The electronics industry is developing new resists that are tailored to the DUV range. One such resist class is chemically amplified resists.

The main components of chemically amplified resist formulations are a photoacid generator compound, a polymer resin and a solvent capable of dissolving the photoacid generator and the resin. For many positive chemically amplified resists, the polymer resin contains acid labile groups which make the polymer resin insoluble in an aqueous developer. Upon irradiation, the photoacid generator compound produces an acid which cleaves the acid labile groups resulting in a polymer resin that is aqueous soluble. Chemically amplified resists have generated a great deal of interest and there are numerous patents available discussing these compositions such as, for example, U.S. Pat. Nos. 5,069,997; 5,035,979; 5,670,299; 5,558,978; 5,468,589; and 5,389,494.

One group of polymers which can be used as resins in chemically amplified resists are acetal or ketal functionalized polymers. The alkali solubility of phenolic resins is greatly inhibited by converting the hydroxyl groups to acetal or ketal groups. Typically, acetal or ketal phenolic resins are produced by reacting a phenolic resin with a vinyl ether in the presence of an acid catalyst.

In addition, patents such as U.S. Pat. Nos. 5,670,259 to Imai et al. (Imai) and 5,714,559 to Schacht et al. (Schacht) disclose the use of cross-linked groups between two polymer chains. In Imai, the cross-linking groups are prepared by coating a substrate with (i) a polymer containing phenol or carboxyl groups and (ii) a compound with two to four vinyl ether groups. The substrate is then heated to form the cross-links between the polymer chains.

In Schacht, the acid labile cross-links are formed by reacting a polymer containing repeating units of hydroxystyrene and a vinylcyclohexanol in the presence of an acid catalyst to form acetal or ketal cross-links.

The acid-labile polymers are formulated with a photoacid generator compound to form a chemically amplified resist product. Upon irradiation, the generated acid cleaves the acid-labile protecting groups resulting in a photoresist which is soluble in an aqueous developer and thereby enhances the solubility of the polymer in the exposed areas without dissolving the unexposed areas.

The problem with the invention in Imai is that the amount of cross-linking is very sensitive to the baking conditions. If the baking conditions are not strictly controlled, the amount of cross-linking will be not be reproducible. This will change the dissolution and exposure characteristics of the resist resulting in a small lithographic process window.

In the Schacht patent, cross-linking between two phenol units of two different polymers was shown to be possible using poly(hydroxystyrene), monovinyl ether and an acid. However, the cross-linking between the two poly (hydroxystyrene) polymer chains is not an efficient and reproducible process in the presence of a monovinyl ether and an acid. Consistent cross-linking is necessary since important thermal and lithographic properties depend upon the reproducibility and extent of cross-linking.

Schacht also showed that cross-linking was formed between phenolic units and alcohol units, (such as cyclohexanol), in the presence of monovinyl ether and an acid. This mode of cross-linking requires a polymer of hydroxystyrene and hydroxycyclohexyl vinyl monomers. These type of copolymers are produced by partially hydrogenating the poly(hydroxystyrene) and such hydrogenation does not give reproducible concentrations of hydroxycyclohexyl moiety in the polymer. Therefore, the variability in the percentage of cyclohexyl moiety can dramatically influence the extent and reproducibility of cross-linking.

Another problem with acid labile, acetal-based resist is that the volatile by-products are formed after exposure to actinic radiation. These volatile by-products may coat the lens of the exposure tool resulting in reliability problems. In addition, volatile by-products cause the resist to shrink, which is not desirable for semiconductor manufacturing.

Therefore, it is an object of the present invention to provide a method of reproducibly preparing a partially cross-linked acid labile polymer suitable for use as a component in a chemically amplified photoresist. The photoresist will have high contrast, increased sensitivity and improved high temperature flow characteristics.

It is another object of this invention to provide a photoresist that has low volatility by-products when exposed to radiation, which will reduce the reliability problems of the exposure tool and results in less shrinkage of the resist.

SUMMARY OF THE INVENTION

The present invention relates to a process for preparing a organically soluble partially cross-linked acid-labile polymer. The resulting partially cross-linked acid-labile polymer may be blended with a photoacid generator in a solvent to formulate a chemically amplified resist composition, which is used in the production of electronics devices. The resulting resist composition is highly reproducible and has a large process window.

The general process for generating an organically soluble partially cross-linked acid labile polymer according to the present invention comprises the steps of providing a polymer with one or more monomer units, wherein at least one of the monomer units contain one or more pendant COOH or hydroxyl groups; and reacting this polymer with a polyvinyl ether in the presence of an acid catalyst to form links between at least two polymer chains. In the present invention, polyvinyl ether means a compound with two or more vinyl ethers.

In a further embodiment of the present invention, a monovinyl ether is added to the above process to form a ketal or acetal protecting groups by functionalizing the monomer units having COOH or hydroxyl pendant groups. In the present invention, monovinyl ether means a compound with only one vinyl ether.

One advantage of this process is that the degree of cross-linking is very reproducible. Unlike U.S. Pat. No. 5,670,259 to Imai, which requires a sensitive bake to cross-link the polymer, the present invention performs the cross-linking in-situ and can reproducibly control the degree of cross-linking by tightly controlling the amount of highly reactive polyvinyl ether used in the reaction. It is also reproducible since the highly reactive polyvinyl ether can efficiently and reproducibly form cross-links between two phenolic units of poly(hydroxystyrene) chains. This is in contrast to the Schacht patent where the monovinyl ether and the acid do not reproducibly form cross-links between two poly(hydroxystyrene) chains.

The invention also provides that the resulting partially cross-linked acid labile polymer is blended with a photoacid generator and dissolved in a solvent to produce a chemically amplified resist composition. Other components to the resist composition can be added such as dyes, surfactants, stabilizers, and the like.

This invention further provides a process for forming a pattern which comprises the steps of providing the chemically amplified resist composition with the organically soluble partially cross-linked acid labile polymer, coating a substrate with the resist composition, imagewise exposing the resist coated substrate to actinic radiation, and forming a resist image by developing the resist coated substrate. Further processing of the substrate may take place after the formation of the resist image.

The advantages of using the partially cross-linked acid labile polymer in a resist system is that these polymers have higher glass transition temperatures which increase the resistance to flow during high temperature process conditions. Since the amount of cross-linking can be tightly controlled, one can readily achieve the desired thermal properties of the resulting resist. In addition, cross-linking also increase the molecular weight of the final polymer. The large difference in molecular weight between the exposed and unexposed areas of the polymer results in greater contrast and improved resolution and profile of the resist. Furthermore, cross-linked polymers tend to have better adhesion to the wafer after development.

In addition, when the acid labile ketal or acetal protecting groups are utilized with the partially cross-linked polymer, there is an increase in contrast and resolution. The acid labile functionalized units are insoluble in aqueous solution and thus prevents development in the unexposed regions resulting in more vertical profiles.

Another advantage of the present invention is that the higher carbon containing acetal or ketal protecting groups have less volatile decomposition alcohol by-products when the organically soluble partially cross-linked polymer is exposed to radiation. Thus, since the amount of volatile alcohol by-products are reduced, there is less shrinkage of the resist, and thereby less chance of coating the lens of the exposure tool. Also, since the higher carbon containing acetal or ketal groups alcohol by-products are not volatile and remain in the resist, it becomes more aqueous soluble. This increases the dissolution rate of the exposed resist, as compared to the unexposed resist, resulting in a higher contrast and better resolution.

Other and further objects, advantages and features of the present invention will be understood by reference to the following specification.

DETAILED DESCRIPTION AND EMBODIMENTS

The process for producing the partially cross-linked acid labile polymers, the photoresist compositions containing the partially cross-linked acid labile polymers, and the process steps for producing the resist image in accordance with the present invention are as follows.

The general process for generating an organically soluble, partially cross-linked acid labile polymer according to the present invention comprises the steps of providing a reactant polymer with one or more monomer units, wherein at least one of the monomer units contain one or more pendant COOH or hydroxyl groups; and contacting the reactant polymer with a polyvinyl ether in the presence of an acid catalyst to form links between at least two polymer chains. The preferred hydroxyl based reactant polymers are phenolic or hydroxycycloalkyl-based polymers or mixtures thereof. The more preferred phenolic-based reactant polymers are polyhydroxystyrene (PHS) and novolaks, and the more preferred hydroxycycloalkyl-based reactant polymer is polyvinylcyclohexanol.

Any suitable polyvinyl ether may be used for this cross-linking process. The preferred polyvinyl ethers have the general formula:

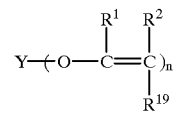

wherein Y is a polyvalent radical; $R^1$, $R^2$ and $R^{19}$ are each independently selected from a hydrogen, a linear or branched $C_1$ to $C_{18}$ alkyl or haloalkyl, a $C_3$ to $C_{18}$ cycloalkyl, a $C_6$ to $C_{14}$ aromatic, a $C_6$ to $C_{30}$ alkaryl or a $C_6$ to $C_{30}$ aralkyl; and n is an integer of 2 or more. Preferably, Y is a linear or branched $C_1$ to $C_{30}$ alkylene, haloalkylene or oxyalkylene, a $C_6$ to $C_{10}$ cycloalkylene or substituted cycloalkylene, a $C_6$ to $C_{14}$ aromatic, a $C_6$ to $C_{30}$ alkarylene or a $C_6$ to $C_{30}$ aralkylene.

The alkyl groups represented by $R^1$, $R^2$ and $R^{19}$ include, but are not limited to, methyl, ethyl, propyl, butyl, amyl, hexyl, heptyl, octyl, nonyl, decyl, undecyl, dodecyl, and the like. The halogens of the haloalkyl represented by $R^1$, $R^2$ and $R^{19}$ include chlorine, bromine, fluorine, and iodine. The aralkyl groups represented by $R^1$, $R^2$ and $R^{19}$ include, but are not limited to, benzyl, phenethyl, phenylpropyl, methylbenzyl, methylphenethyl and ethylbenzyl. Preferably $R^1$, $R^2$ and $R^{19}$ are hydrogens.

The alkylene group represented by Y include, but are not limited, to methylene, ethylene, propylene, butylene, amylene, hexylene, heptylene, octylene, nonylene, decylene, undecylene, dodecylene, and the like. The oxyalklene groups represented by include oxymethylene, oxyethylene, oxypropylene, oxybutylene, oxyamylene, oxyhexylene, and the like. The aralkyl groups represented by Y include, but are not limited to, benzylene, phenethylene, phenylpropylene, methylbenzylene, methylphenethylene and ethylbenzylene. The cycloalkylene groups represented by Y include cyclohexylene and substituted cyclohexylene. The preferred Y is:

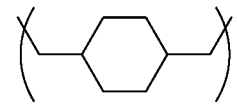

More preferably, the polyvinyl ether is selected from the group consisting of: cyclohexanedimethanol divinyl ether, ethyleneglycol divinyl ether, butanediol divinyl ether, hexanedimethanol divinyl ether, diethyleneglycol divinyl ether, triethyleneglycol divinyl ether, tetraethyleneglycol divinyl ether, trimethylol propane trivinyl ether, erithritol tetravinyl ether, poly-ethylene oxide divinyl ether and poly-butylene oxide divinyl ether.

In another embodiment of the present invention, a monovinyl ether is added to the above described process to functionalize the hydroxyl or COOH groups and form acetal or ketal protecting groups. Any suitable vinyl ethers may be used for the acetalization or ketalization process. Preferably, the monovinyl ether has the formula:

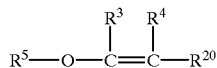

wherein $R^3$, $R^4$ and $R^{20}$ are each independently selected from a hydrogen, a linear or branched $C_1$ to $C_{18}$ alkyl or haloalkyl, a $C_3$ to $C_{18}$ cycloalkyl, a $C_6$ to $C_{14}$ aromatic, a $C_6$ to $C_{30}$ alkaryl or a $C_6$ to $C_{30}$ aralkyl; and $R^5$ is a linear or branched $C_1$ to $C_{18}$ alkyl or haloalkyl, a $C_3$ to $C_{18}$ cycloalkyl, a $C_6$ to $C_{14}$ aromatic, a $C_6$ to $C_{30}$ alkaryl, a $C_6$ to $C_{30}$ aralkyl or a linear, branched, cyclic, aromatic or olefinic group.

The alkyl groups represented by $R^3$, $R^4$ and $R^{20}$ include, but are not limited to, methyl, ethyl, propyl, butyl, amyl, hexyl, heptyl, octyl, nonyl, decyl, undecyl, dodecyl, and the like. The halogens of the haloalkyl represented by $R^3$, $R^4$ and $R^{20}$ include chlorine, bromine, fluorine, and iodine. The aralkyl groups represented by $R^3$, $R^4$ and $R^{20}$ include, but are not limited to, benzyl, phenethyl, phenylpropyl, methylbenzyl, methylphenethyl and ethylbenzyl. Preferably, $R^3$, $R^4$ and $R^{20}$ are hydrogens.

The alkyl groups represented by $R^5$ include, but are not limited to, methyl, ethyl, propyl, butyl, amyl, hexyl, heptyl, octyl, nonyl, decyl, undecyl, dodecyl, and the like. The halogens of the haloalkyl represented by $R^5$ include chlorine, bromine, fluorine, and iodine. The aralkyl groups represented by $R^5$ include, but are not limited to, benzyl, phenethyl, phenylpropyl, methylbenzyl, methylphenethyl and ethylbenzyl. The preferable $R^5$ groups are secondary and tertiary alkyls preferably having greater than 6 carbon atoms. The more preferable $R^5$ group is $C_6$ to $C_{30}$ alkyl, aralkyl or alkaryl whose photodecomposition products have a boiling point greater than 100C. Higher boiling point decomposition by-products result in less volatility, less resist shrinkage and higher contrast as was described above.

The more preferred vinyl ethers are ethyl vinyl ether, tertiary-butyl vinyl ether cyclohexyl vinyl ether, 2-ethyl hexyl vinyl ether and dodecyl vinyl ether.

Other suitable reactant polymers for this process are novolaks which are typically used as resins for photoresist. The hydroxyl sites of novolaks may be also be functionalized with the present process to form acid labile protecting or cross-links groups.

It should also be noted that each repeating unit of the polymer may contain one or more hydroxyl or COOH groups. For example, the reactant polymer may contain a dihydroxy phenyl repeating unit. The acid labile functionalization reaction may occur on none, either, or both hydroxyl sites depending on the overall degree of functionalization.

The overall degree of functionalization and derivatization of the hydroxyl or COOH sites is controlled by the amount of monovinyl ethers and polyvinyl ether respectively used in the feedstock. The degree of cross-linking will increase as the amount of polyvinyl ether is increased; while the degree of acetalization or ketalization will increase as the amount of monovinyl ether is increased.

It should be noted that the order of reaction can be performed in any suitable manner. For example, the reactant polymer can be acetal or ketal functionalized before the resulting polymer is cross-linked utilizing the polyvinyl ethers. On the other hand, the reactant polymer can first be cross-linked before the acetal or ketal protecting reaction with the monovinyl ether. Preferably, the acid catalyst, monovinyl ether and polyvinyl ether are added together so that only one synthesis is required.

In a typical synthesis procedure, a hydroxyl or COOH based reactant polymer or copolymer is dissolved in any suitable solvent or solvent mixture. The solvent present should be inert under the reaction conditions. Suitable solvents may include aromatic hydrocarbons, chlorinated hydrocarbons, esters, and ethers such as tetrahydrofuran, (THF), 1,4-dioxane, methylene chloride, propylene glycol monomethyl ether acetate, (PGMEA), and dimethoxyethane. Preferred solvents for the reaction are THF and PGMEA.

To such a polymer solution mentioned above, the polyvinyl and monovinyl ethers are added at room temperature. The desired concentration of reactant polymer or copolymer dissolved in the solvent is about 10 weight percent to 60 weight percent. The amounts of polyvinyl ether will vary from about 0.0001 to 5 mole % of the total moles of COOH or hydroxyl groups in the polymer, while the monovinyl ether may vary from about 0.01 mole percent to 60 mole percent of the total moles of COOH or hydroxyl groups. The preferable range of polyvinyl ether is 0.1 to 1.5% mole percent; while the monovinyl ether is about 5 mole percent to 40 mole percent.

An acid catalyst is added and the reaction mixture is allowed to stir for about 4 to 24 hours. The preferred reaction time is about 20 hours. Any suitable acid catalyst may be used for the reaction such as hydrochloric acid, sulfuric acid, malonic acid, oxalic acid, para-toluene sulfonic acid and pyridinium-para-toluene sulfonate. The preferred acid catalyst is oxalic acid. The acid catalyst may be added in amounts ranging from about 0.0001 weight percent to 3.0 weight percent based on the weight of the polymer. The preferred amount of acid catalyst added is about 0.001 to 0.1 weight percent. The acid catalyst is normally quenched with an organic or inorganic base. The acid labile derived hydroxystyrene based polymer is isolated by any suitable polymer isolation procedure such as by precipitation in a non-solvent.

In a preferred embodiment, the hydroxyl based reactant polymer has the formula:

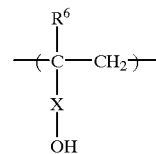

wherein X is defined as:

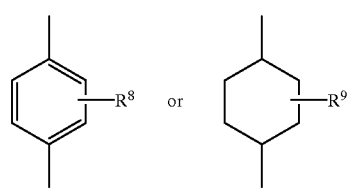

or mixtures thereof; $R^6$, $R^8$ and $R^9$ are each independently a hydrogen, a $C_1$ to $C_4$ alkyl, a halogen, a nitro, a cyano or combinations thereof.

Preferred reactant polymers are hydroxyl based polymers such as polyhydroxystyrene, novolaks or polyvinylcyclohexanol and mixtures thereof.

In an another embodiment of the invention, the structure of the backbone in the reactant polymer may be further modified to include aqueous insoluble monomers such as:

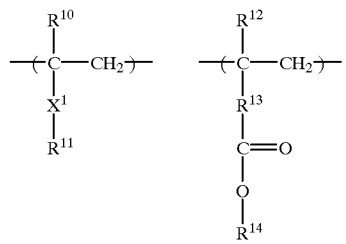

wherein $R^{10}$ is a hydrogen, a $C_1$ to $C_4$ alkyl, a halogen, a nitro, a cyano or a combination thereof; $R^{11}$ is a hydrogen, a linear of branched $C_1$ to $C_{18}$ alkyl or haloalkyl, a $C_3$ to $C_{18}$ cycloalkyl, a $C_6$ to $C_{14}$ aromatic, a $C_6$ to $C_{30}$ alkaryl or a $C_6$ to $C_{30}$ aralkyl; $R^{12}$ is a hydrogen, methyl or ethyl group, or a group having the formula —$CH_2$—$COOR^7$; $R^7$ is a primary, secondary and tertiary carbon attached to an alkyl or aromatic group; $R^{13}$ is a valent bond or methylene; $R^{14}$ is a primary, secondary and tertiary carbon attached to an alkyl or aromatic group and $X^1$ is defined as

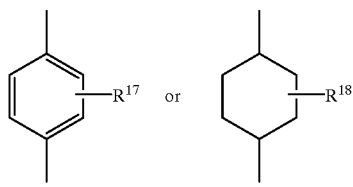

In a further embodiment of the invention, the reactant polymer, such as polyhydroxystyrene or polyvinylcyclohexanol-based polymers may further be modified to incorporate a tertiary butoxycarbonyloxy (t-BOC) or tertiary-butyloxycarbonylmethoxy (BOCMe) functional groups. The t-BOC functional group can be introduced by reacting the hydroxyl containing polymers and copolymers with di-tertiary-butyl dicarbonate in the presence of any suitable organic or inorganic base such as dimethyl amino pyridine. Similarly, BOCMe functional group can be introduced by reacting the polymers or copolymers with tertiary-butyl bromoacetate. With these reactions, for example, one of the monomer units of the functionalized polymer of hydroxystyrene would be as follows:

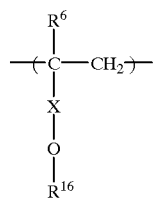

wherein $R^6$ is as defined above; and $R^{16}$ is t-BOC or BOCMe.

Thus, the alkali insoluble monomer unit may contain either acid sensitive or non-acid sensitive groups. Preferred monomer units with acid sensitive groups include t-butoxystyrene, tertiary butoxycarbonyloxy (t-BOC) styrene, acetal protected hydroxystyrene, or tertiary-butyloxycarbonyl-methyl (BOCMe) protected hydroxystyrene, and/or acid sensitive (meth)acrylates such as t-butyl (meth)acrylate. Preferred non-acid sensitive monomers include various (meth)acrylates, and substituted or unsubstituted styrenes (e.g., styrene, 4-acetoxystyrene).

In another preferred embodiment, the reactant polymer will have the following repeating monomer units:

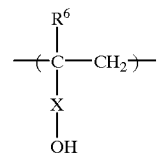

with an optional repeating unit having either formula set for below::

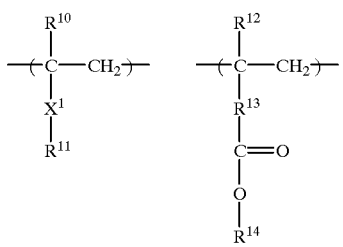

After the polyvinyl ether, acid catalyst, monovinyl ethers, and, optional, di-tertiary-butyl dicarbonate and/or tertiary-butyl bromoacetate are reacted with the reactant polymer with, for example, all three monomer repeating units above, the resulting organically soluble partially cross-linked polymer would have the following monomer repeating units:

I

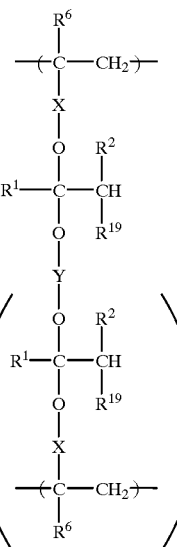

II

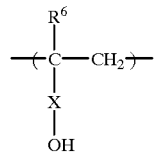

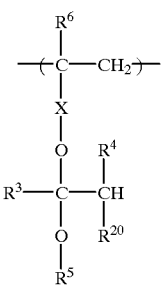

and at least one monomer unit selected from the formulae:

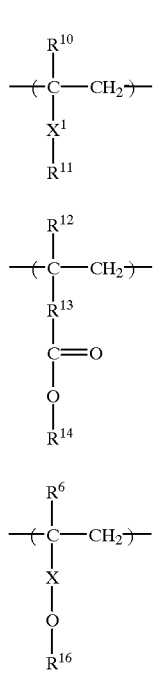

wherein X, $X^1$, $R^1$ to $R^{20}$ are defined above, and k is an integer of 1 or more.

The more preferred organically soluble cross-linked polymer has the repeating units I, II, III and VI.

Preferred mole % concentration for the repeating monomer units of the organically soluble, cross-linked acid labile polymer are shown in Table 1 below:

TABLE I

| Monomer Unit | Preferred Mole % Range | More Preferred Mole % Range |
| --- | --- | --- |
| I | 0.001 to 3% | 0.1 to 1.5% |
| II | 40 to 95% | 50 to 90% |
| III | 10 to 50% | 10 to 35% |
| IV | 0 to 40% | 0 to 25% |
| V | 0 to 40% | 0 to 10% |
| VI | 0 to 20% | 5 to 15% |

The invention further relates to the formulation of photoresist compositions comprising a partially cross-linked acid labile polymer as produced above, a photoacid generator and a solvent capable of dissolving both the partially cross-linked acid labile polymer and the photoacid generator. The preferred partially-cross-linked acid labile polymers for the photoresist compositions are those that were previously described in the preferred partially cross-linked acid labile polymer process and composition embodiments above.

As described previously, the organically soluble partially cross-linked polymer of the present invention has many advantages when used in a photoresist. The advantages of using the partially cross-linked acid labile polymer in a resist system is that these polymers have higher glass transition temperatures which increase the resistance to flow during high temperature process conditions. Since the amount of cross-linking can be tightly controlled, one can achieve the desired thermal properties of the resulting resist. In addition, cross-linking also increase the molecular weight of the final polymer. The large difference in molecular weight between the exposed and unexposed areas of the polymer results in greater contrast and improved resolution and profile of the resist. Furthermore, cross-linked polymers tend to have better adhesion to the wafer after development.

In addition, when the acid labile ketal or acetal protecting groups are utilized with the partially cross-linked polymer, there is an increase in contrast and resolution. The acid labile functionalized units are insoluble in aqueous solution and thus prevent development in the unexposed regions resulting in more vertical profiles.

It is also believed that the higher carbon (6 or more carbons) containing acetal or ketal protecting groups generate less volatile alcohol by-products upon exposure to radiation. Volatile alcohol by-products can coat the lens of the exposure tool resulting in increased exposure tool reliability problems. Also, the non-volatile alcohol by-products, generated by the higher carbon-containing acetal or ketal groups remain in the resist, which reduces resist shrinkage and enhances aqueous solubility. This increases the dissolution rate of the exposed resist as compared to the unexposed resist resulting in a higher contrast and better resolution.

Any suitable photoacid generator compounds may be used in the photoresist composition. The photoacid generator compounds are well known and include, for example, onium salts such as diazonium, sulfonium, sulfoxonium and iodonium salts, and disulfones. Suitable photoacid generator compounds are disclosed, for example, in U.S. Pat. Nos. 5,558,978 and 5,468,589 which are incorporated herein by reference.

Suitable examples of photoacid generators are phenacyl p-methylbenzenesulfonate, benzoin p-toluenesulfonate, α-(p-toluenesulfonyloxy)methylbenzoin 3-(p-toluenesulfonyloxy)-2-hydroxy-2-phenyl-1-phenylpropyl ether, N-(p-dodecylbenzenesulfonyloxy)-1,8-naphthalimide and N-(phenylsulfonyloxy)-1,8-napthalimide.

Other suitable compounds are o-nitrobenzaldehydes which rearrange on actinic irradiation to give o-nitrosobenzoic acids such as 1-nitrobenzaldehyde and 2,6-nitrobenzaldehyde, α-haloacylphenones such as α,α,α-trichloroacetophenone and p-tert-butyl-α,α,α-trichloroacetophenone, and sulfonic esters of o-hydroxyacylphenones, such as 2-hydroxybenzophenone methanesulfonate and 2,4-hydroxybenzophenone bis (methanesulfonate).

Still other suitable examples of photoacid generators are triphenylsulfonium bromide, triphenylsulfonium chloride, triphenylsulfonium iodide, triphenylsulfonium hexafluorophosphate, triphenylsulfonium hexafluoroarsenate, triphenylsulfonium hexafluoroarsenate, triphenylsulfonium trifluoromethanesulfonate, diphenylethylsulfonium chloride, phenacyldimethylsulfonium chloride, phenacyltetrahydrothiophenium chloride, 4-nitrophenacyltetrahydrothipheniumn chloride and 4-hydroxy-2-methylphenylhexahydrothiopyrylium chloride.

Further examples of suitable photoacid generators for use in this invention are bis(p-toluenesulfonyl)diazomethane, methylsulfonyl p-toluenesulfonyldiazomethane, 1-cyclohexylsulfonyl-1-(1,1-dimethylethylsulfonyl)diazometane, bis(1,1-dimethylethylsulfonyl)diazomethane, bis(1-methylethylsulfonyl)diazomethane, bis(cyclohexylsulfonyl)diazomethane, 1-p-toluenesulfonyl-1-cyclohexylcarbonyldiazomethane, 2-methyl-2-(p-toluenesulfonyl)propiophenone, 2-methanesulfonyl-2-methyl-(4-methylthiopropiophenone, 2,4-methyl-2-(p-toluenesulfonyl)pent-3-one, 1-diazo-1-methylsulfonyl-4-phenyl-2-butanone, 2-(cyclohexylcarbonyl-2-(p-toluenesulfonyl)propane, 1-cyclohexylsulfonyl-1cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2 diazo-2-(p-toluenesulfonyl)acetate, 2-nitrobenzyl p-toluenesulfonate, 2,6-dinitrobenzyl p-toluenesulfonate, 2,4-dinitrobenzyl p-trifluoromethylbenzenesulfonate.

Other suitable examples of photogenerators are hexafluorotetrabromo-bisphenol A, 1,1,1-tris(3,5-dibromo-4-hydroxyphenyl)ethane and N-(2,4,6-tribromophenyl)-N'-(p-toluenesulfonyl)urea.

The photoacid generator compound is typically employed in the amounts of about 0.0001 to 20% by weight of polymer solids and more preferably about 1% to 10% by weight of polymer solids.

The choice of solvent for the photoresist composition and the concentration thereof depends principally on the type of functionalities incorporated in the acid labile polymer, the photoacid generator, and the coating method. The solvent should be inert, should dissolve all the components in the photoresist, should not undergo any chemical reaction with the components and should be re-removable on drying after coating. Suitable solvents for the photoresist composition may include ketones, ethers and esters, such as methyl ethyl ketone, methyl isobutyl ketone, 2-heptanone, cyclopentanone, cyclehexanone, 2-methoxy-1-propylene acetate, 2-methoxyethanol, 2-ethoxyothanol, 2-ethoxyethyl acetate, 1-methoxy-2-propyl acetate, 1,2-dimethoxy ethane ethyl acetate, cellosolve acetate, propylene glycol monoethyl ether acetate, methyl lactate, ethyl lactate, methyl pyruvate, ethyl pyruvate, methyl 3-methoxypropionate, ethyl 3-methoxypropionate, N-methyl-2-pyrrolidone, 1,4-dioxane, ethylene glycol monoisopropyl ether, diethylene glycol monoethyl ether, diethylene glycol monomethyl ether, diethylene glycol dimethyl ether, and the like.

In an additional embodiment, base additives may be added to the photoresist composition. The purpose of the base additive is to scavenge protons present in the photoresist prior to being irradiated by the actinic radiation. The base prevents attack and cleavage of the acid labile groups by the undesirable acids, thereby increasing the performance and stability of the resist. The percentage of base in the composition should be significantly lower than the photoacid generator because it would not be desirable for the base to interfere with the cleavage of the acid labile groups after the photoresist composition is irradiated. The preferred range of the base compounds, when present, is about 3% to 50% by weight of the photoacid generator compound. Suitable examples of base additives are 2-methylimidazole, triisopropylamine, 4-dimethylaminopryidine, 4,4'-diaminodiphenyl ether, 2,4,5 triphenyl imidazole and 1,5-diazobicyclo[4.3.0]non-5-ene.

Dyes may be added to the photoresist to increase the absorption of the composition to the actinic radiation wavelength. The dye must not poison the composition and must be capable of withstanding the process conditions including any thermal treatments. Examples of suitable dyes are fluorenone derivatives, anthracene derivatives or pyrene derivatives. Other specific dyes that are suitable for photoresist compositions are described in U.S. Pat. No. 5,593,812.

The photoresist composition may further comprise conventional additives such as adhesion promoters and surfactants. A person skilled in the art will be able to choose the appropriate desired additive and its concentration.

The invention further relates to a process for forming a pattern on a substrate which comprises the following process steps: application of a photoresist coating comprising one of the compositions described above to the substrate; imagewise exposure of the coating to actinic radiation; treatment of the coating with an alkaline aqueous developer until the areas of the coating which have been exposed to the radiation detach from the substrate and an imaged photoresist structured coating remains on the substrate.

The photoresist composition is applied uniformly to a substrate by known coating methods. For example, the coatings may be applied by spin-coating, dipping, knife coating, lamination, brushing, spraying, and reverse-roll coating. The coating thickness range generally covers values of about 0.1 to more than 10 $\mu$m. After the coating operation, the solvent is generally removed by drying. The drying step is typically a heating step called soft bake where the resist and substrate are heated to a temperature of about 50° C. to 150° C. for about a few seconds to a few minutes; preferably for about 5 seconds to 30 minutes depending on the thickness, the heating element and end use of the resist.

The photoresist compositions are suitable for a number of different uses in the electronics industry. For example, it can be used as electroplating resist, plasma etch resist, solder resist, resist for the production of printing plates, resist for chemical milling or resist in the production of integrated circuits. The possible coatings and processing conditions of the coated substrates differ accordingly.

For the production of relief structures, the substrate coated with the photoresist composition is exposed imagewise. The term 'imagewise' exposure includes both exposure through a photomask containing a predetermined pattern, exposure by means of a computer controlled laser beam which is moved over the surface of the coated substrate, exposure by means of computer-controlled electron beams, and exposure by means of X-rays or UV rays through a corresponding mask.

Radiation sources which can be used are all sources which emit radiation in which the photoacid generator is sensitive. Examples are argon ion, krypton ion, electron beams and x-rays sources.

The process described above for the production of relief structures preferably comprises, as a further process measure, heating of the coating between exposure and treatment with the developer. With the aid of this heat treatment, known as "post-exposure bake", virtually complete reaction of the acid labile groups in the polymer resin with the acid generated by the exposure is achieved. The duration and temperature of this post-exposure bake can vary within broad limits and depend essentially on the functionalities of the polymer resin, the type of acid generator and on the concentration of these two components. The exposed resist is typically subjected to temperatures of about 50° C. to 150° C. for a few seconds to a few minutes. The preferred post exposure bake is from about 80° C. to 130° C. for about 5 seconds to 300 seconds After imagewise exposure and any heat treatment of the material, the exposed areas of the photoresist are removed by dissolution in a developer. The choice of the particular developer depends on the type of photoresist; in particular on the nature of the polymer resin or the photolysis products generated. The developer can comprise aqueous solutions of bases to which organic solvents or mixtures thereof may have been added. Particularly preferred developers are aqueous alkaline solutions. These include, for example, aqueous solutions of alkali metal silicates, phosphates, hydroxides and carbonates, but in particular of tetra alkylammonium hydroxides, and more preferably tetramethylammonium hydroxide (TMAH). If desired, relatively small amounts of wetting agents and/or organic solvents can also be added to these solutions.

After the development step, the substrate carrying the resist coating is generally subjected to at least one further treatment step which changes substrate in areas not covered by the photoresist coating. Typically, this can be implantation of a dopant, deposition of another material on the substrate or an etching of the substrate. This is usually followed by the removal of the resist coating from the substrate typically by an oxygen plasma etch or a wet solvent strip.

This invention is explained below in further detail with references to examples, which are not by way of limitation, but by way of illustration.

Examples 1 and 2 below illustrate the synthesis procedure involved in generating the acetal polymers.

EXAMPLE 1

Synthesis of partially cross-linked Poly[p-(2-ethyl hexyloxy ethoxy) styrene/p-hydroxystyrene]

A polymer solution was prepared by dissolving 90 grams of poly (p-hydroxystyrene) (PHS) in 310 grams of propylene glycol monomethyl ether acetate (PGMEA) at room temperature. The weight average molecular weight of the PHS was 8000 and the polydispersity (PD) was 1.17. The solution was concentrated by distilling at 60 to 70° to form a 30% solid solution. To this concentrated solution, 1.47 grams of cyclcohexanedimethanol divinyl ether, 29.12 grams of 2-ethyl hexyl vinyl ether (EHVE) and 120 milligrams of oxalic acid was added and stirred at room temperature for about 16 to 24 hours. After the reaction, 4 grams of pyridine was added and stirred for 2 hours. The solution was then washed with a solution of hexane/acetone/water. The PGMEA layer was separated and distilled to remove the residual hexane/acetone/water. The polymer was found to have 20–22% blocking levels of EHVE groups by $^{13}$C-NMR. The molecular weight of the polymer was approximately 34000 and the PD was approximately 1.73.

EXAMPLE 2

Synthesis of partially cross-linked Poly[p-(cyclohexyloxy ethoxy) styrene/p-hydroxystyrene]

A polymer solution was prepared by dissolving 60 grams of poly (p-hydroxystyrene) (PHS) in 310 grams of propylene glycol monomethyl ether acetate (PGMEA) at room temperature. The weight average molecular weight of the PHS was 8000 and the (PD) was 1.17. The solution was concentrated by distilling at 60 to 70° to form a 30% solid solution. To this concentrated solution, 1.47 grams of cyclcohexanedimethanol divinyl ether, 15.75 grams of cycolhexyl vinyl ether (CHVE) and 90 milligrams of oxalic acid was added and stirred at room temperature for about 16 to 24 hours. After the reaction, 4 grams of pyridine was added and stirred for 2 hours. The solution was then washed with a solution of hexane/acetone/water. The PGMEA layer was separated and distilled to remove the residual hexane/acetone/water. The polymer was found to have 20–22% blocking levels of CHVE groups by $^{13}$C-NMR. The molecular weight of the final polymer was approximately 34000 and the PD was approximately 1.73.

EXAMPLES 3 AND 4

Formulation and lithographic procedure for the polymers synthesized in Examples 1 & 2.

The polymer synthesized is example 1 and 2 (96.875% by weight) were both formulated with 3% by weight of a triphenylsulphonium salt (photoacid generator), and 0.125% by weight of base additives. The concentrations of the above components are based on the percentage of total solids. The above components were dissolved in PGMEA to form a 16% by weight solid solution.

After the formulation, the resist solutions were filtered through a 0.2 um filter and used directly for lithography. The wafers were then spun to give a uniform film thickness of around 7800 Å. These photoresist coated wafers were then soft baked at 115° C. for 60 seconds. The soft baked photoresist coated wafers were then exposed to 248 nm wavelength light on an ISI XLS 7800 0.53 NA stepper. The exposure dose was 15 mj/cm$^2$. After completion of exposure, the wafers were subjected to a post exposure bake (PEB) at 100° C. for 60 seconds. Following the PEB, the wafers were puddle or spray-developed using a 0.26N tetramethyl ammonium hydroxide aqueous developer.

Each imaged photoresist-coated substrate was evaluated for several important properties, such as standing waves, % film shrinkage and equal line/space pair resolution (res.). The % film shrinkage, which is a measure of the volatility of the acid-labile by-products, was calculated by measuring the thickness before exposure T1, and the thickness of the film after exposure T2. The % film shrinkage is the difference in thickness before and after the exposure and is calculated by the formula ((T1−T2)/T1) ×100. The results are summarized in Table II.

TABLE II

| Example | Polymer Synthesized | Exposure dose (mJ/cm$^2$) | Resolution μm | Standing wave | % Film Shrinkage |
|---|---|---|---|---|---|
| 5 | Example 1 | 15 | 0.175–0.200 | Acceptable | 0.60 |
| 6 | Example 2 | 15 | 0.175–0.200 | Acceptable | 0.78 |

The results show that the photoresist compositions have excellent resolution of 0.2 μm and below with good sensitivity. The compositions also have good film shrinkage and standing wave properties.

EXAMPLE 5

Effect of cross-linking on resist profiles and thermal flow

To determine the effect of cross-linking on resist profiles and thermal flow properties, two acetal-containing polymer samples were synthesized with and without cross-links.

Both polymers contained nearly identical mole% of EHVE and t-boc protecting groups. The polymer without cross-linking had a molecular weight of 8000, while the partially cross-linked polymer has a molecular weight of approximately 34,000. The two polymers were synthesized under conditions similar to examples 1 and 2, except the non-cross-linked polymer synthesis did not contain the divinyl ether. Both polymers were also formulated and lithographically processed under the same conditions as examples 3 and 4. After resist exposure and development, a SEM analysis showed similar resolution, but the profiles of the partially cross-linked polymer were more vertical.

In addition, the thermal stability of the resist with partially cross-linked polymer was better than the resist without cross-linking. This was determined by baking both resists at various temperatures for 4 minutes. The non-cross-linked polymer resist profiles started to degrade and became less vertical (more rounded) at 120° C. In contrast, the partially cross-linked polymer resist profile did not start to degrade until 130° C. The 10° C. change in thermal flow is a significant improvement in terms of process temperature window performance.

The foregoing is illustrative of the present invention and is not construed as limiting thereof. The invention is defined by the following claims with equivalents of the claims to be included therein.

What is claimed is:

1. A process for preparing an organically soluble partially cross-linked polymer comprising the steps of: providing a reactant polymer with one or more monomer units, wherein at least one of the monomer units contain 1 or more pendant COOH groups or hydroxyl groups; and reacting said polymer with a polyvinyl ether in the presence of an acid catalyst to form links between at least two polymer chains.

2. The process of claim 2 wherein the polyvinyl ether has the formula:

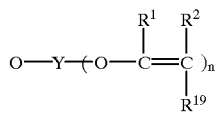

wherein Y is a polyvalent radical; $R^1$, $R^2$ and $R^{19}$ are each independently selected from a hydrogen, a linear or branched $C_1$ to $C_{18}$ alkyl or haloalkyl, a $C_3$ to $C_{18}$ cycloalkyl, a $C_6$ to $C_{14}$ aromatic, a $C_6$ to $C_{30}$ alkaryl or a $C_6$ to $C_{30}$ aralkyl; and n is an integer of 2 or more.

3. The process of claim 2 wherein Y is a linear or branched $C_1$ to $C_{18}$ alkyl, haloalkyl or alkoxy, a $C_6$ to $C_{10}$ cycloalkyl, a $C_6$ to $C_{30}$ aromatic, a $C_6$ to $C_{30}$ alkaryl or a $C_6$ to $C_{30}$ aralkyl.

4. The process of claim 3 wherein said reactant polymer is a phenolic-based polymer, a hydroxy cycloalkyl-based polymer or mixtures thereof.

5. The process of claim 4 wherein said reactant polymer is a hydroxystyrene based polymer.

6. The process of claim 1 further comprising reacting a monovinyl ether of the formula:

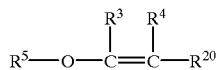

with said reactant polymer to partially substitute the hydroxyl groups of said polymer with acid labile protecting groups; wherein $R^3$, $R^4$ and $R^{20}$ are each independently selected from a hydrogen, a linear or branched $C_1$ to $C_{18}$ alkyl or haloalkyl, a $C_3$ to $C_{18}$ cycloalkyl, a $C_6$ to $C_{14}$ aromatic, a $C_6$ to $C_{30}$ alkaryl or a $C_6$ to $C_{30}$ aralkyl; ; and $R^5$ is a linear or branched $C_1$ to $C_{18}$ alkyl or haloalkyl, a $C_3$ to $C_{18}$ cycloalkyl, a $C_6$ to $C_{14}$ aromatic, a $C_6$ to $C_{30}$ alkaryl, a $C_6$ to $C_{30}$ aralkyl; or a linear, branched, cyclic aromatic or olefinic group.

7. The process of claim 6 wherein said reactant polymer has at least one monomer unit of the formula:

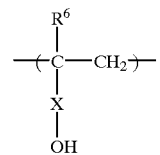

wherein X is defined as:

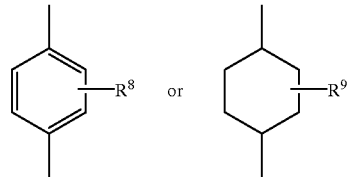

or mixtures thereof; and wherein $R^6$, $R^8$ and $R^9$ are each independently a hydrogen, a $C_1$ to $C_4$ alkyl, a halogen, a nitro, a cyano, or a combination thereof.

8. The process of claim 7 wherein said reactant polymer further comprises having at least one monomer unit of the formula:

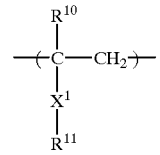

wherein $R^{10}$ is a hydrogen, a $C_1$ to $C_4$ alkyl, a halogen, a nitro, a cyano or a combination thereof; $R^{11}$ is a hydrogen, a linear or branched $C_1$ to $C_{18}$ alkyl or haloalkyl, a $C_3$ to $C_{18}$ cycloalkyl, a $C_6$ to $C_{14}$ aromatic, a $C_6$ to $C_{30}$ alkaryl or a $C_6$ to $C_{30}$ aralkyl; $X^1$ is

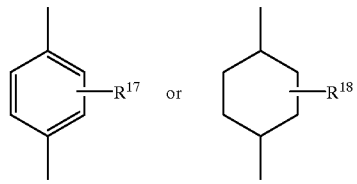

and $R^{17}$ and $R^{18}$ are each independently a hydrogen, a $C_1$ to $C_4$ alkyl, a halogen, a nitro, a cyano, or a combination thereof.

9. The process of claim 7 wherein said reactant polymer further comprises having a monomer unit of the formula:

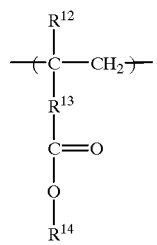

wherein $R^{12}$ is a hydrogen, methyl or ethyl group, or a group having the formula —$CH_2$—$COOR^7$; $R^7$ is a primary, secondary and tertiary carbon attached to an alkyl or aromatic group, $R^{13}$ is a bond or methylene, and $R^{14}$ is a primary, secondary or tertiary carbon attached to an alkyl or aromatic group.

10. The process of claim 7 wherein said reactant polymer is reacted with at least one di-tertiary-butyl dicarbonate and tertiary-butyl haloacetate in the presence of an organic or inorganic base to form t-butoxy carbonyl and/or t-butoxycarbonylmethyl groups.

11. The process of claim 7 wherein the polyvinyl ether is selected from the group consisting of: cyclohexanedimethanol divinyl ether, ethylene glycol divinyl ether, butanediol divinyl ether, hexanedimethanol divinyl ether, diethyleneglycol divinyl ether, triethyleneglycol divinyl ether, tetraethyleneglycol divinyl ether, trimethoyl propane trivinyl ether, erithritol tetravinyl ether, poly-ethylene oxide divinyl ether and polybutylene oxide divinyl ether.

12. The process of claim 1 wherein said acid catalyst is selected from the group consisting of: hydrochloric acid, sulfuric acid, oxalic acid, benzoic acid, p-nitrobenzoic acid, malonic acid, para-toluene sulfonic acid, and pyridinium-para-toluene sulfonate.

13. The process of claim 7 wherein $R^5$ contains 6 or more carbon atoms.

14. The process of claim 7 wherein said monovinyl ether is selected from the group consisting of: ethyl hexyl vinyl ether, cyclohexyl vinyl ether, tertiary butyl vinyl ether and dodecyl vinyl ether.

15. The process of claim 14 wherein the polyvinyl ether is cyclohexanedimethanol divinyl ether, and the monovinyl ether is ethyl hexyl vinyl ether.

* * * * *

UNITED STATES PATENT AND TRADEMARK OFFICE
CERTIFICATE OF CORRECTION

PATENT NO.: 6,072,006

DATED: June 6, 2000

INVENTORS: Nageshwer Rao Bantu, Donald Frank Perry, Jacqueline Marie Marshall and Timothy Michale Holt It is certified that error appears in the above-identified patent and that said Letters Patent is hereby corrected as shown below:

Column 15, claim 2, line 40, delete "0-" so that the drawing looks like the following:

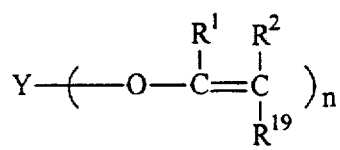

Column 15, claim 3, line 51, delete "$C_6$ to $C_{30}$" and insert --$C_6$ to $C_{14}$--

Signed and Sealed this

Fifteenth Day of May, 2001

Attest:

NICHOLAS P. GODICI

*Attesting Officer*  *Acting Director of the United States Patent and Trademark Office*